(12) United States Patent
Liu et al.

(10) Patent No.: US 7,785,966 B2
(45) Date of Patent: Aug. 31, 2010

(54) METHOD FOR FABRICATING FLOATING GATES STRUCTURES WITH REDUCED AND MORE UNIFORM FORWARD TUNNELING VOLTAGES

(75) Inventors: Shih-Chang Liu, Yuku Village (TW); Wen-Ting Chu, Kaohsiung County (TW); Chi-Hsin Lo, Zhubei (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 761 days.

(21) Appl. No.: 11/614,677

(22) Filed: Dec. 21, 2006

(65) Prior Publication Data

US 2008/0149985 A1 Jun. 26, 2008

(51) Int. Cl.
*H01L 21/8247* (2006.01)
(52) U.S. Cl. .................. 438/267; 438/593; 438/981; 257/E21.681
(58) Field of Classification Search .................. 438/201, 438/211, 257, 593, 267, 981; 257/E21.681
See application file for complete search history.

(56) References Cited

U.S. PATENT DOCUMENTS 6,300,196 B1* 10/2001 Chang .................. 438/257
6,653,188 B1* 11/2003 Huang et al. .................. 438/257
6,847,068 B2* 1/2005 Chuang et al. .................. 257/260
6,878,986 B2 4/2005 Shyu et al.
7,253,470 B1* 8/2007 Liu et al. .................. 257/316
7,329,578 B2* 2/2008 Wei .................. 438/257
2003/0216048 A1* 11/2003 Lin et al. .................. 438/694
2005/0056883 A1 3/2005 Chen et al.
2005/0082601 A1 4/2005 Chu et al.
2006/0286738 A1* 12/2006 Wei .................. 438/201

* cited by examiner

*Primary Examiner*—Mary Wilczewski
*Assistant Examiner*—Toniae M Thomas
(74) *Attorney, Agent, or Firm*—Duane Morris LLP (57) ABSTRACT

An improved method for fabricating floating gate structures of flash memory cells having reduced and more uniform forward tunneling voltages. The method may include the steps of: forming at least two floating gates over a substrate; forming a mask over each of the floating gates, each of the masks having a portion, adjacent to a tip of a respective one of the floating gates, of a given thickness, wherein the given thicknesses of the mask portions are different from one another; and etching the masks to reduce the different given thicknesses of the mask portions to a reduced thickness wherein the reduced thickness portions of the mask are of a uniform thickness.

13 Claims, 12 Drawing Sheets

METHOD FOR FABRICATING FLOATING GATES STRUCTURES WITH REDUCED AND MORE UNIFORM FORWARD TUNNELING VOLTAGES

FIELD OF INVENTION

The present invention relates to semiconductor and integrated circuit fabrication. More particularly, the present invention relates to an improved method for fabricating floating gate structures of flash memory cells having reduced and more uniform forward tunneling voltages.

BACKGROUND OF THE INVENTION

The trend in semiconductor fabrication is to increase circuit integration by shrinking device sizes on a chip. Many new techniques have been developed to accomplish this. For example, the Deep Ultra-Violate (DUV) technique is commonly used to enhance the resolution of photolithography in semiconductor fabrication by using a light source having wavelength of 193 nm or 157 nm. The development of DUV technology has advanced semiconductor manufacturing technology into deep sub-micron processes. As to circuit integration, the self-alignment technique has increased the level of integration of circuits.

The size of non-volatile memory cells (memory cells which store data without power) have been decreasing by applying new fabrication processes or new structures. A variety of memory devices have been proposed or used in non-volatile memories. One commonly known device is the Flash EPROM (Erasable and Programmable Read-Only Memory). A flash EPROM typically comprises a large matrix of memory cells formed on a substrate, wherein each cell is formed by a floating gate transistor. The floating gate transistor of the flash memory cell typically comprises a floating gate disposed between a control gate and a channel region of the substrate. The floating gate is electrically isolated from the control gate and the channel region by thin insulating films or layers. The flash memory cell is operated by removing (erasing) electrons from the floating gate or placing (program) electrons on the floating gate. This process is achieved by applying a voltage between the control gate and the source or drain and is called Fowler-Nordheim Tunneling.

Figure 1:
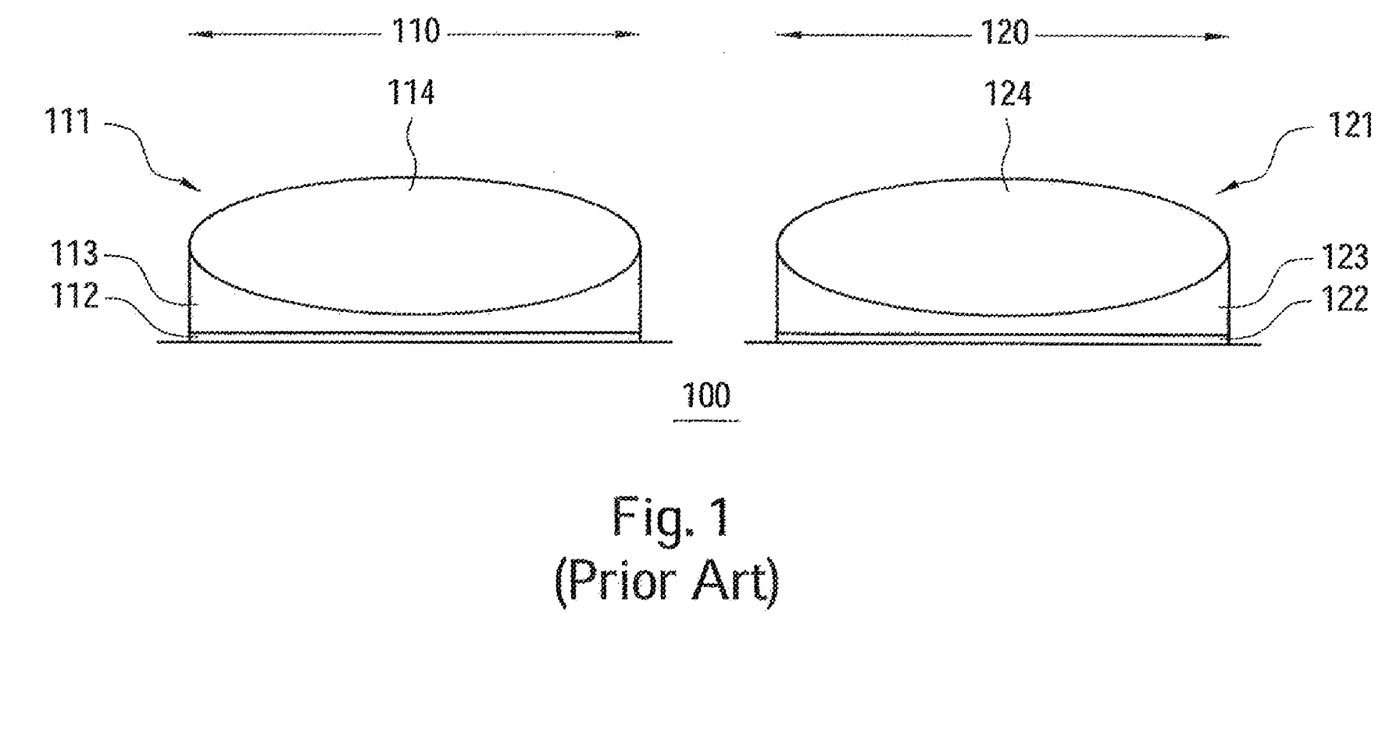
FIG. 1 is an elevational view of a substrate having two different areas on which first and second floating gate structures are conventionally formed.

The floating gate of the flash memory cell may be formed by an electroconductive (e.g. polysilicon) gate layer covered by an oxide mask which provides isolation between the floating gate and the word line. Conventional oxidation methods are typically used to form the floating gate oxide masks during the fabrication of the memory cell matrix on the substrate. FIG. 1 shows a substrate 100 having two different areas 110 and 120 on which conventional first and second floating gate structures 111 and 121 are formed. The first floating gate structure 111 formed on the first area 110 of the substrate 100 comprises a first tunnel oxide 112 disposed on the substrate 100, a first floating gate 113 disposed on the first tunnel oxide 112 and a first oxide mask 114 disposed on the first floating gate 113. The second floating gate structure 121 formed on area 120 of the substrate 100 comprises a second tunnel oxide 122 disposed on the substrate 100, a second floating gate 123 disposed on the second tunnel oxide 122, and a second oxide mask 124 disposed on the second floating gate 123. The first and second oxide masks 114 and 124 have been formed by a conventional oxidation method and have substantially the same thickness.

Figure 2:
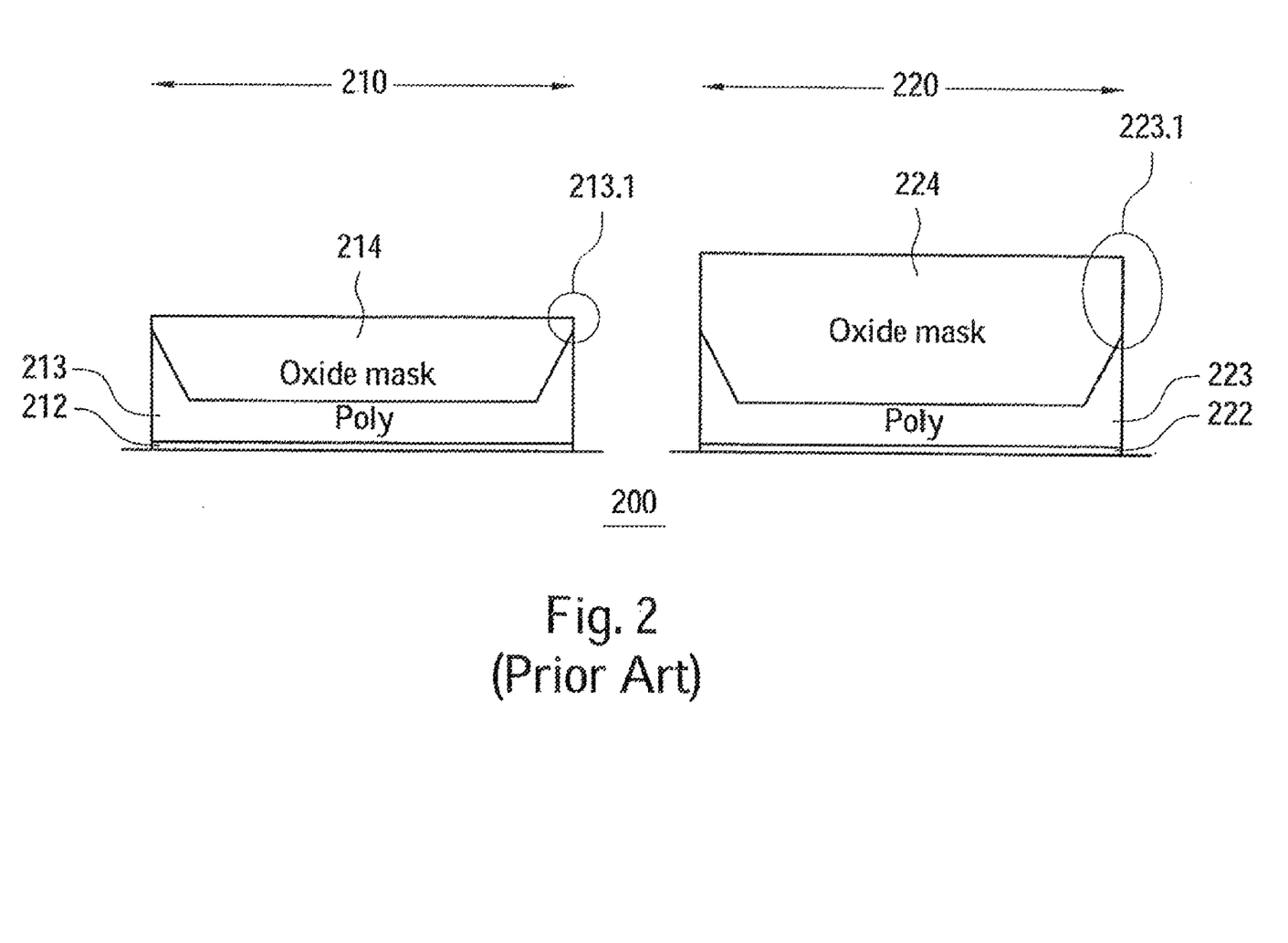
FIG. 2 is an elevational view of a substrate having two different areas on which first and second floating gate structures are formed by an existing CMP floating gate process.

New fabrication processes have been developed to achieve continued flash memory size reductions. One such process is the chemical-mechanical polish (CMP) floating gate formation process. FIG. 2 shows a substrate 200 having two different areas 210 and 220 on which first and second floating gate structures 211 and 221 are formed by an existing CMP floating gate process. The first floating gate structure 211 formed on the first area 210 of the substrate 200 comprises a first tunnel oxide 212 disposed on the substrate 200, a first floating gate 213 disposed on the first tunnel oxide 212, and a first oxide mask 214 disposed on the first floating gate 213. The second floating gate structure 221 formed on area 220 of the substrate 200 comprises a second tunnel oxide 222 disposed on the substrate 200, a second floating gate 223 disposed on the second tunnel oxide 222, and a second oxide mask 224 disposed on the second floating gate 223.

Although the CMP process improves the kissing effect (i.e., where an oxide mask produced by an oxidation method extends across the narrow space between two floating gates and bridges them together) and produces a square top oxide mask profile that lowers the probability of cell to cell bridging and allows for downward scaling, the oxide masks 214 and 224 are not of substantially the same thickness, as depicted in FIG. 2. The non-uniform oxide mask thicknesses undesirably widen the forward tunneling voltage (FTV) range of the EPROM. In addition, as depicted in FIG. 2, the relatively thick oxide mask material (encircled) above the tip regions 213.1, 223.1 of the floating gates 213, 223, increases the FTV of the gates, thus, slowing the erase performances of the cells.

Accordingly, there is a need for floating gate structures with reduced and more uniform forward tunneling voltages.

SUMMARY

A method according to one embodiment comprises the steps of: forming a floating gate over a substrate, the floating gate having a tip; forming a mask over the floating gate, the mask having a portion adjacent to the tip of a given thickness; and etching the mask to reduce the given thickness of the mask portion.

In some embodiments, the method further comprises the step of forming a control gate over the floating gate. The substrate, the floating gate and the control gate, in some embodiments, define a memory cell. The memory cell, in some embodiments, comprises a flash memory cell.

In further embodiments, the floating gate forming step comprises the steps of: forming a floating gate layer over the substrate; forming a trench in the floating gate layer; filling the trench with an insulative material; and planarizing the insulative material. In some embodiments, the floating gate forming step further comprises the steps of: forming a stop layer over the floating gate layer prior to the trench forming step, the stop layer operating as a process stop for the planarizing step; and removing the stop layer after the planarizing step. In some embodiments, the planarizing step is performed by a chemical-mechanical polishing process.

In some embodiments, the tip is pointed. In some embodiments, the etching step sharpens the pointed tip.

In some embodiments, the mask etching step is performed by an isotropic etching process.

A method according to another embodiment, comprises the steps of: forming at least two floating gates over a substrate, each of the floating gates having a tip; forming a mask over each of the floating gates, each of the masks having a portion adjacent to the tip of their respective floating gate of a given thickness, the given thicknesses of the mask portions being different from one another; and etching the masks to reduce the different given thicknesses of the mask portions to a reduced thickness. In some embodiments, the reduce thickness portions of the mask are of a uniform thickness.

A memory device comprising: a substrate; at least two floating gates disposed over the substrate a mask disposed over each of the floating gates, each of the masks having a portion adjacent to the tip which is of a reduced thickness; and a control gate disposed over each of the floating gates. In some embodiments, the reduce thickness portions of the masks are of a uniform thickness. In some embodiments, the memory device comprises a flash memory device. In some embodiments each of the at least two floating gates and their corresponding control gates define a memory cell. In some embodiments, the memory cells comprise flash memory cells.

DETAILED DESCRIPTION

Figure 12:
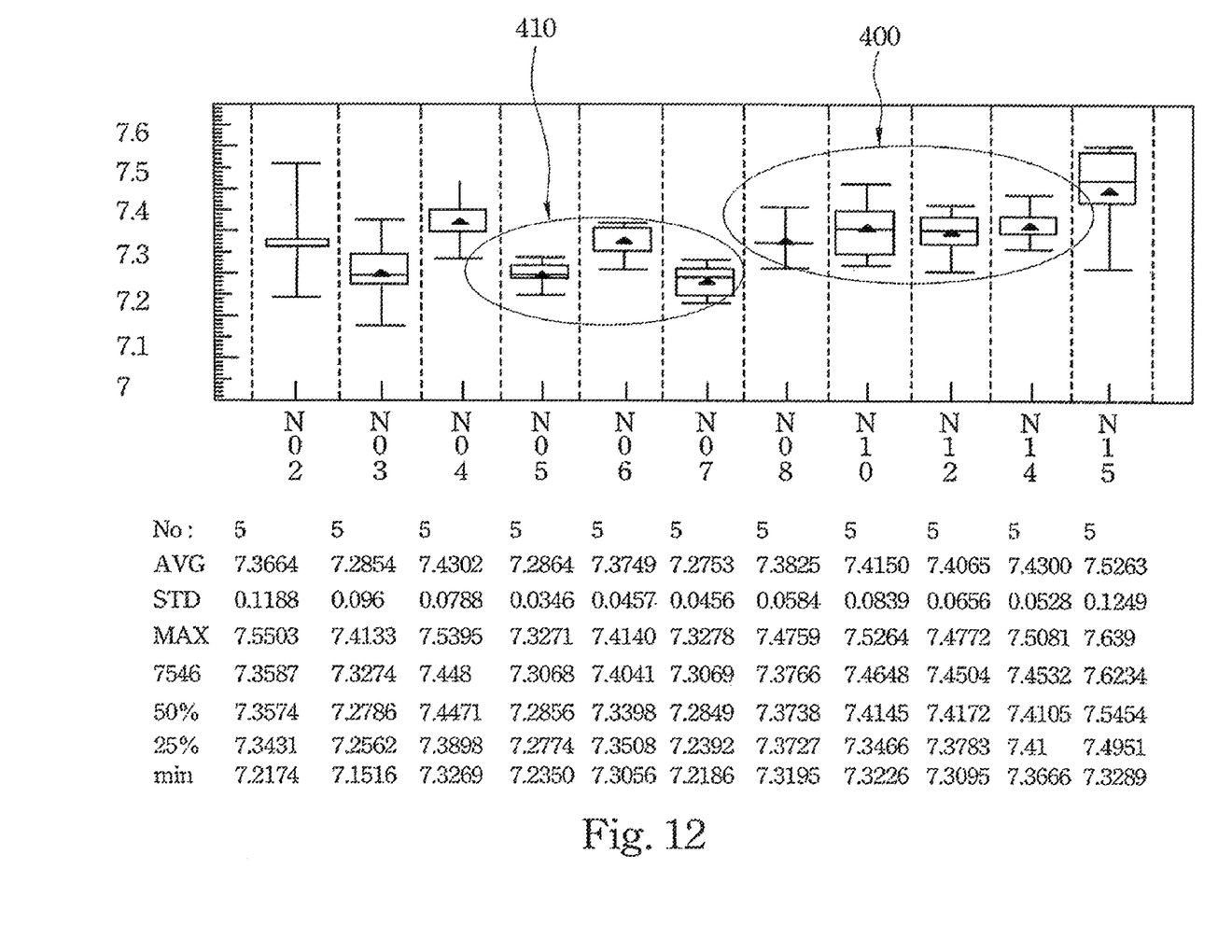
FIG. 12 is a bar graph showing FTVs and FTV ranges of floating gate structures formed by the improved method, and FTVs and FTV ranges of floating gate structures formed by a prior art method.

FIGS. 3-10 are partial, sectional views illustrating an embodiment of an improved method for fabricating floating gate structures of flash memory cells having reduced and more uniform forward tunneling voltages. The method may use a chemical-mechanical polish (CMP) floating gate formation process commonly used in 0.13 technology for partially forming the floating gate structures of the flash memory cells. As shown in FIG. 12, the floating gate structures 410 formed by the method have lower FTVs and narrower cell-to-cell FTV ranges than prior art floating gate structures 400. The lower FTVs improve the erase performances of the floating gate structures and the narrower FTV range provides a more uniform erase performance from cell-to-cell. The flash memory cells described herein may be used in embedded memory applications including, without limitation, smart cards and communication IC's.

Figure 3:
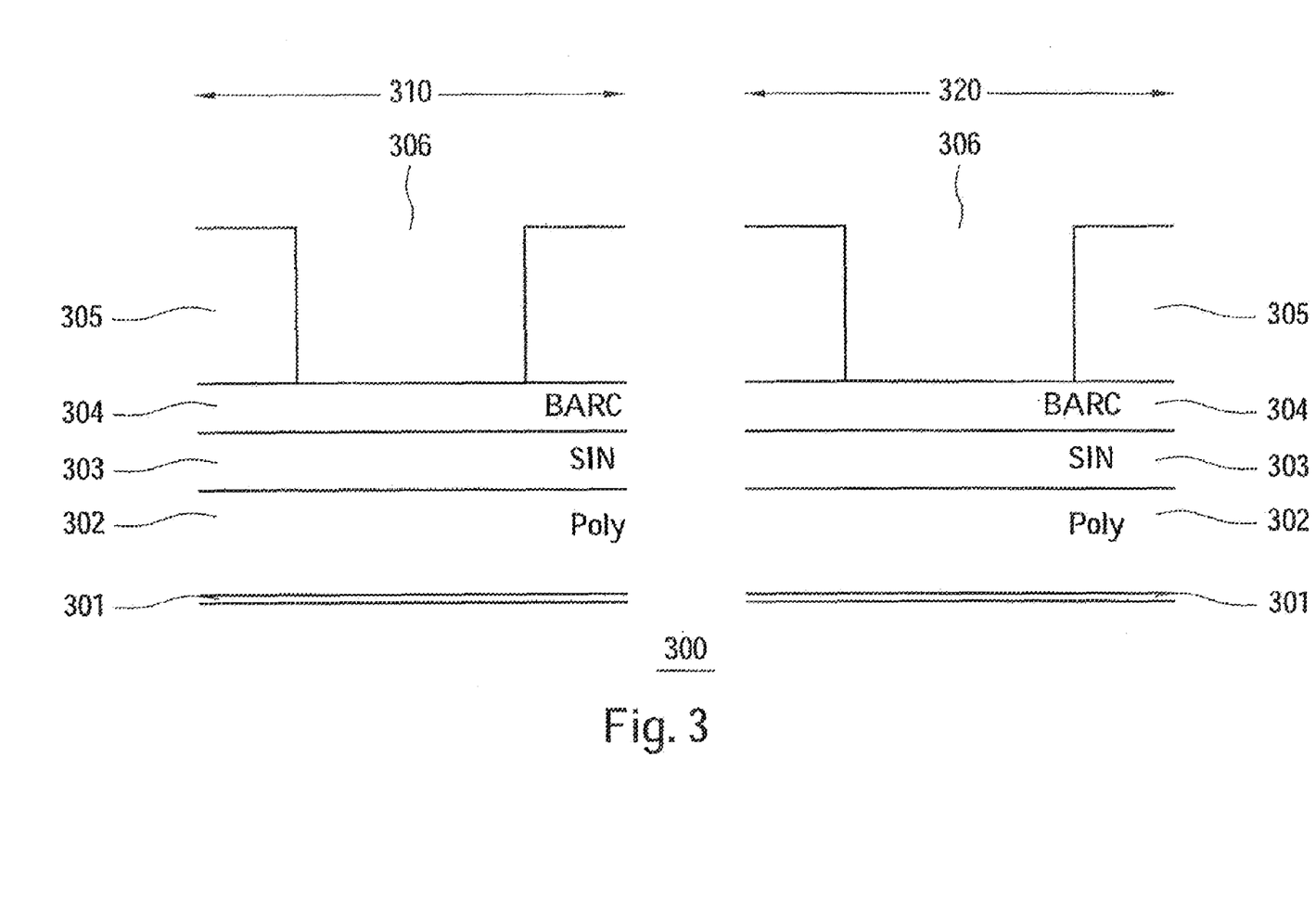
FIGS. 3-11 are partial, sectional views illustrating an embodiment of an improved method for fabricating floating gate structures of flash memory cells having reduced and more uniform forward tunneling voltages.

Referring initially to FIG. 3, a substrate 300 comprising first and second areas 310 and 320 (where memory cells are to be formed), respectively, may be provided. In one embodiment, the first area 310 is the center of the substrate 300 and the second area 320 is the edge of the substrate 300. Formed on the substrate 300 in both the first and second areas 310, 320 thereof may be an insulating layer 301, a floating gate layer 302, a CMP stop layer 303, a bottom anti-reflective coating (BARC) layer 304, and a photoresist layer 305.

The substrate 300 may be a silicon substrate, a silicon-germanium substrate, a silicon-on-insulator (SOI) substrate, a III-V compound substrate or any other substrate or wafer having semiconductor properties.

The insulating layer 301 may be a silicon oxide layer, a silicon nitride layer or any other suitable insulating layer or layers capable of functioning as a tunneling dielectric. The insulating layer 301 may be formed by a thermal oxidation process using oxygen as a reaction gas. Alternatively, the insulating layer 301 may be formed by an atmospheric or low pressure chemical vapor deposition (APCVD or LPCVD) process using silane ($SiH_4$) and oxygen as reaction gases.

The floating gate layer 302 may be formed of an electro-conductive material. In some embodiments, the floating gate layer 302 may be a polysilicon layer or any other suitable layer capable of functioning as a floating gate. The floating gate layer 302 may be formed by an APCVD or LPCVD process by using $SiH_4$ as a reaction gas.

The CMP stop layer 303 may be a silicon nitride layer, silicon oxide layer, or any other suitable layer or layers capable of functioning as a CMP stop. The CMP stop layer 303 may be formed by an APCVD or LPCVD process using dichlorosilane ($SiCl_2H_2$) and ammonia ($NH_3$) as reaction gases.

The BARC layer 304 may be made from an organic material such as silicon oxynitride or any other suitable material capable of functioning as a BARC layer. The BARC layer 304 may be formed using any suitable spin on process. The BARC layer 304 minimizes reflections from the CMP stop layer 303 which could interfere with precise pattering of the photoresist layer 305.

The photoresist layer 305 has been photolithographically patterned, exposed, and developed to form openings 306 above the BARC layer 304 (in the first and second areas 310, 320 of the substrate 300).

Figure 4:
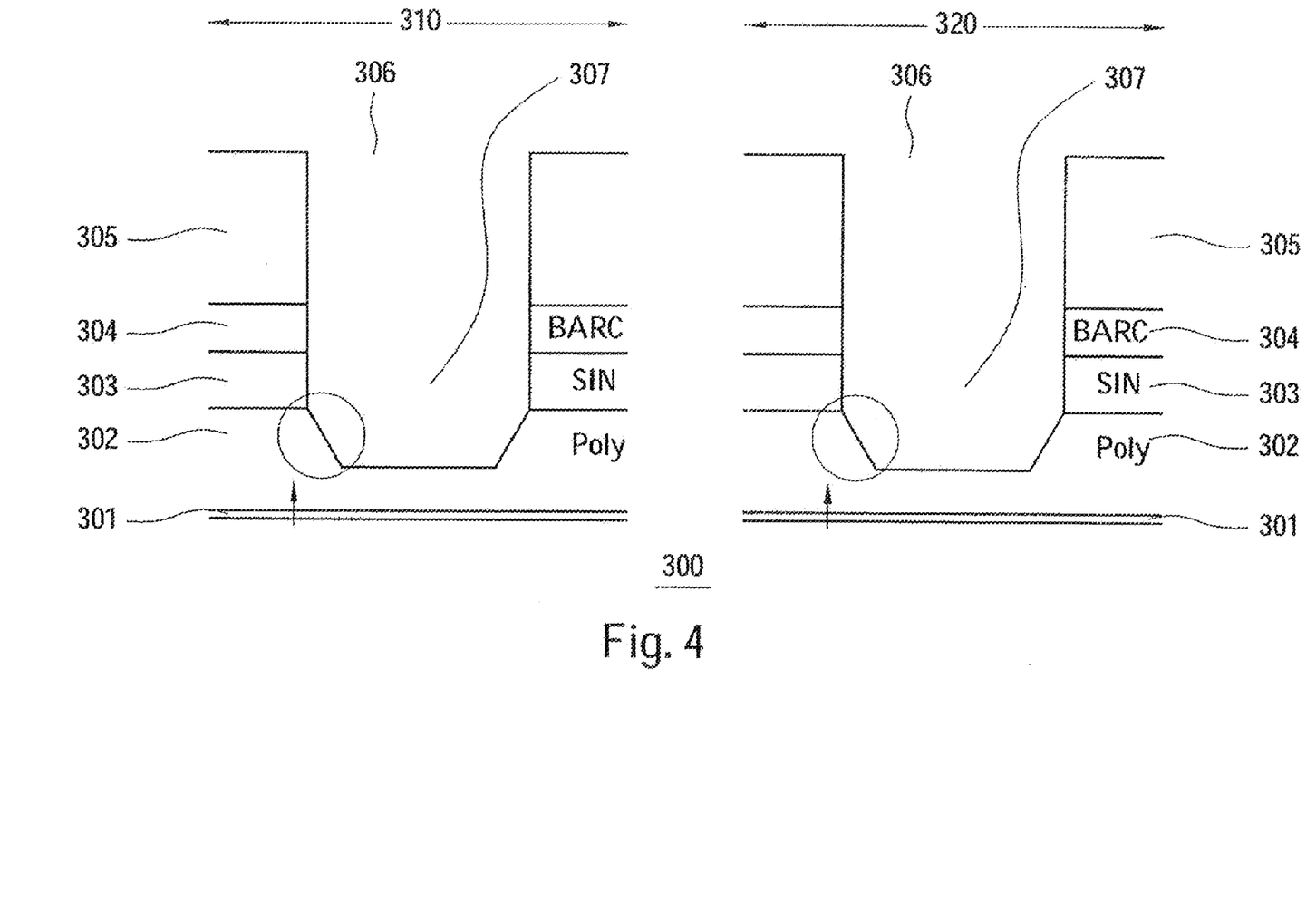

FIG. 4 shows the substrate 300 after performing a floating gate etch process on the substrate 300, wherein the patterned photoresist layer 305 functions as an etch mask. In one embodiment, the floating gate etch process may be performed using an anisotropic dry etching process. The floating gate etch process etches the portions of the BARC layer 304 which are exposed by the openings 306 it the patterned photoresist layer 305. The etching process forms trenches 307 that extend entirely through the BARC layer 304 and the CMP stop layer 303, and terminates in the floating gate layer 302. The etching process should be selected to create trenches 307 having a sloped trench profile (encircled) in the floating gate layer 302.

Figure 5:
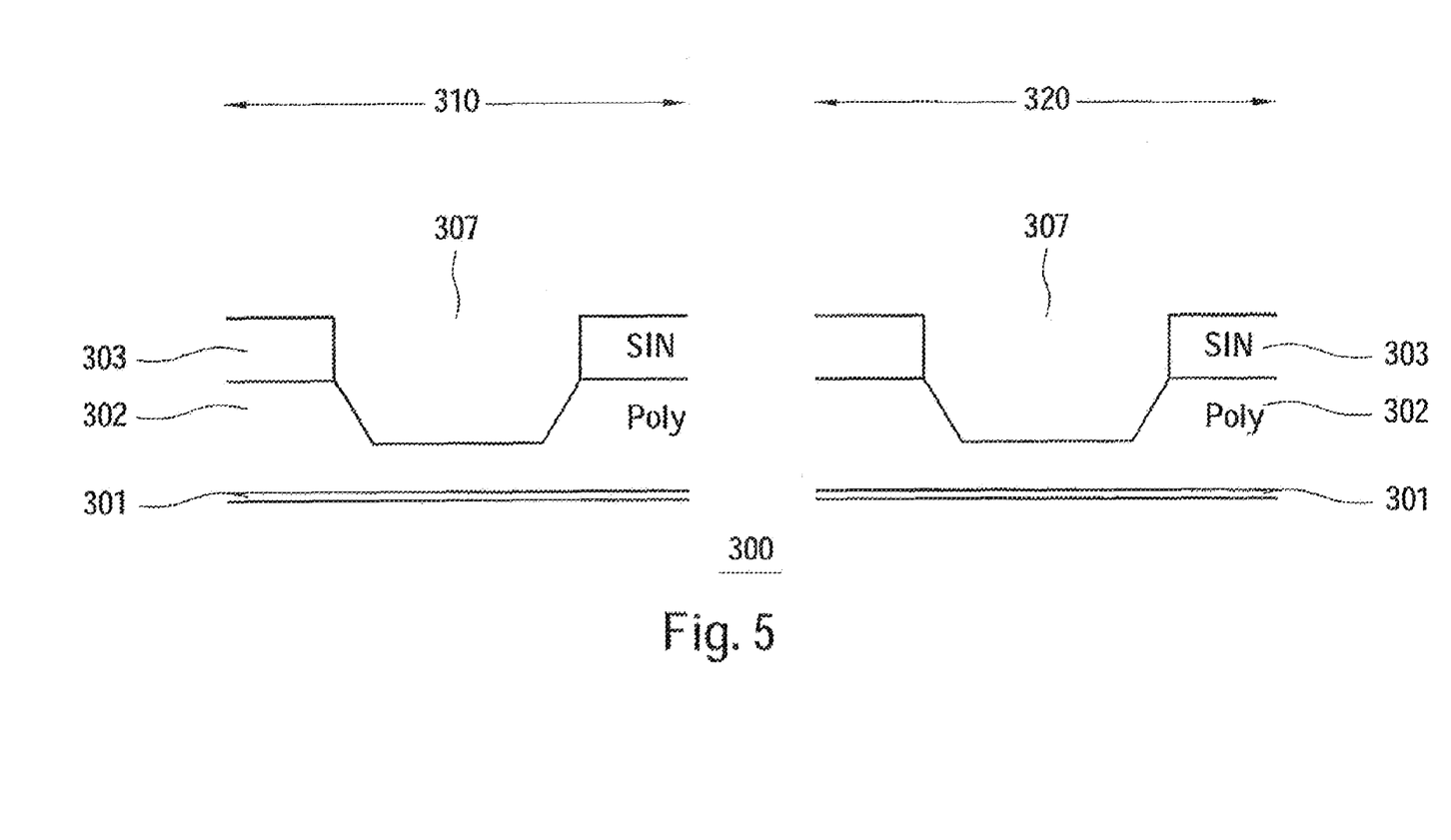

After the trenches 307 are formed, the photoresist layer 305 and the BARC layer 304 are removed as shown in FIG. 5, using any suitable ashing process. The ashing process may be performed by dry etching the substrate 300 using oxygen, for example. Alternatively, the ashing process may be performed by wet etching the substrate 300 using, for example, sulfuric acid ($H_2SO_4$) and hydrogen peroxide ($H_2O_2$).

Figure 6:
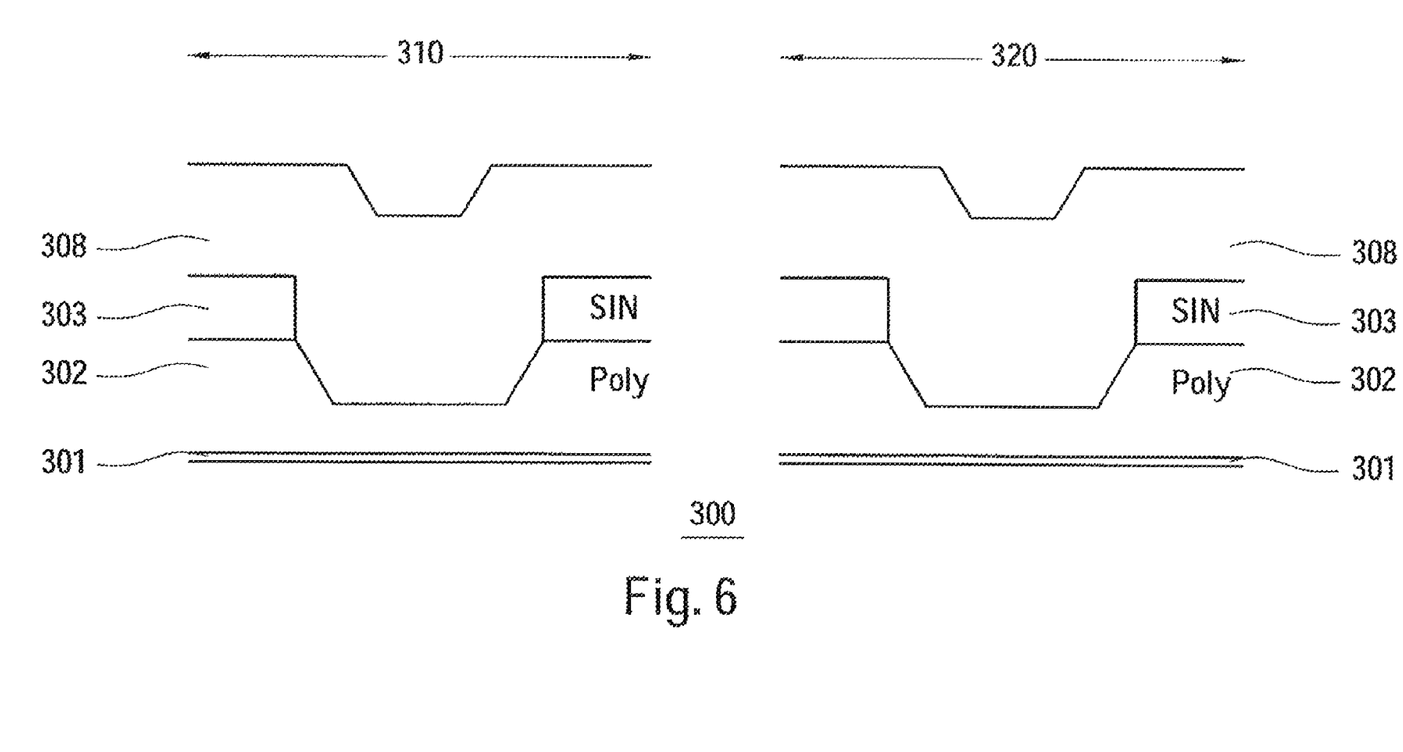

As shown in FIG. 6, a conformal filling layer 308 may be formed over the substrate 300. The filling layer 308 is formed to a thickness that completely fills the trenches 307. The filling layer 308 may be a dielectric layer, such as a silicon dioxide. The filling layer 308 may be formed by a HDP (high density plasmas) CVD, APVCVD, or LPCVD process using $SiH_4$ and oxygen as reaction gases. In one embodiment, the thickness of filling layer 308 (and oxide produced by HDP-CVD) is about 1200 angstroms.

Figure 7:
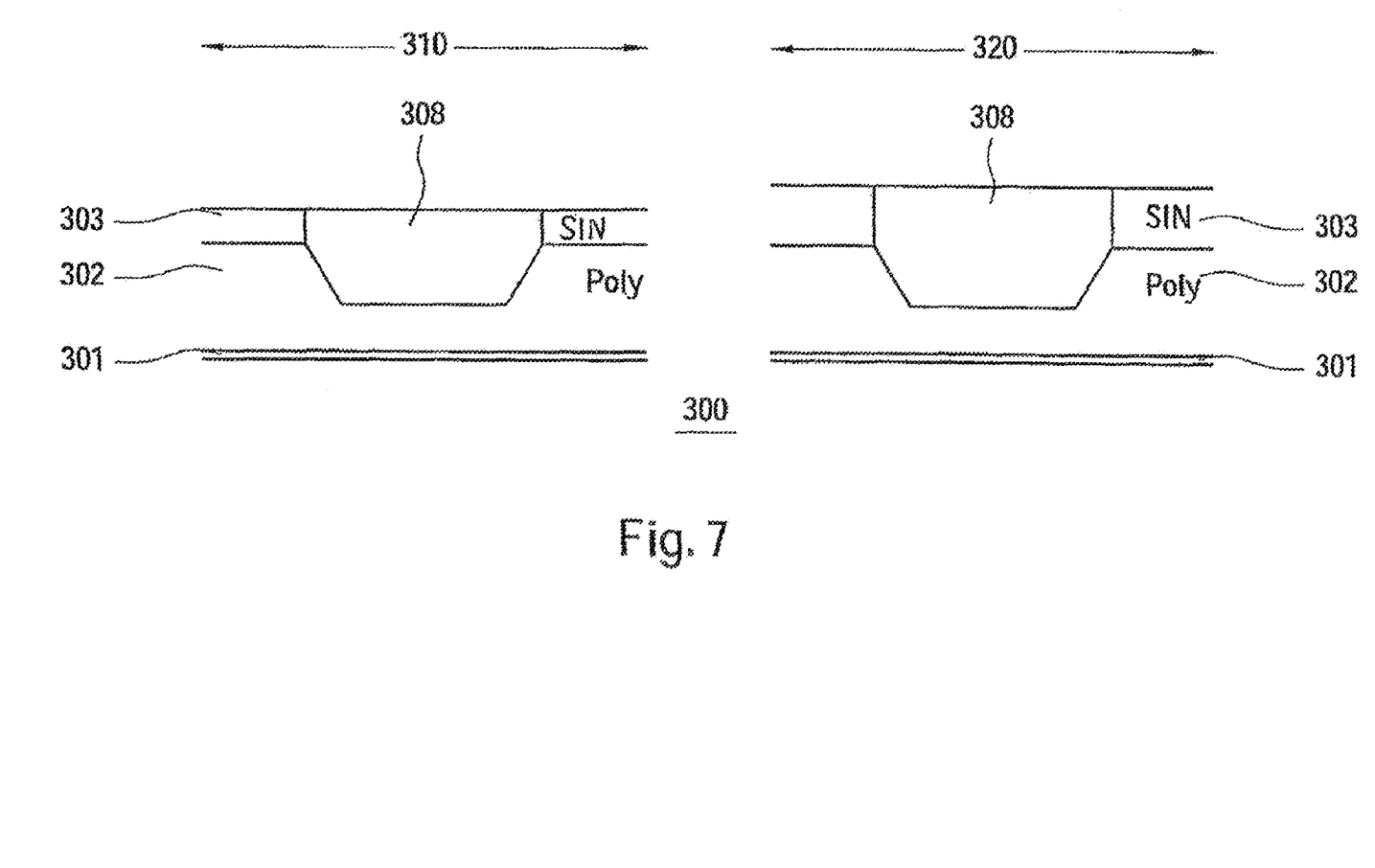

The substrate 300 shown in FIG. 6 is subsequently planarized using a CMP process. FIG. 7 shows the substrate 300 after planarizing. The CMP process is performed until the CMP stop layer 303 is exposed and the filling layer 308 is level with the CMP stop layer 303, in the first and second areas 310, 320. The CMP process typically produces a non-uniform result across the substrate 300 wherein more of the stop layer 303 and therefore more of the filling layer 308 are removed in the center of the substrate (the first area 310) than at the edge of the substrate (the second area 320). Consequently, the thickness of the filling layer 308 in the first area 310 of the substrate 300 is different (e.g., thinner as shown) from the thickness of the filling layer 308 in the second area 320 (e.g., thicker as shown).

Figure 8:
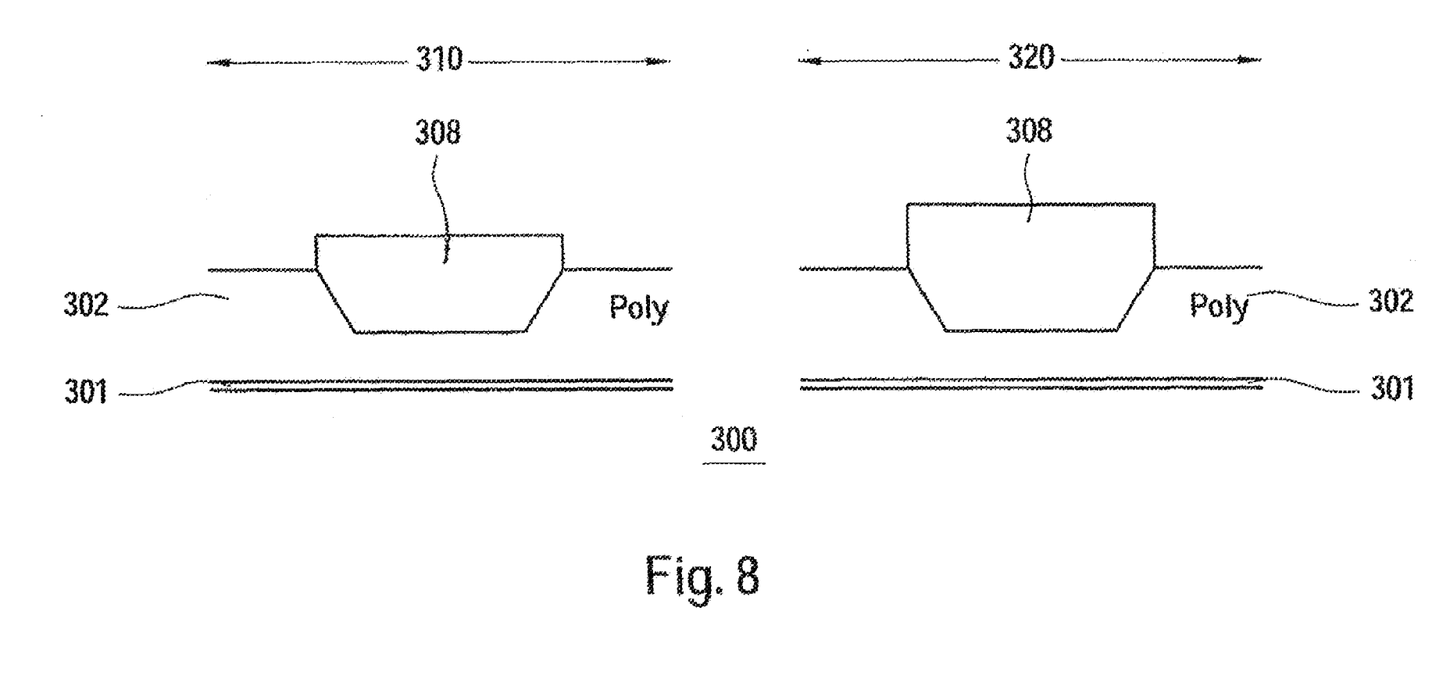

The CMP stop layer 303 is subsequently removed, as shown in FIG. 8. The varying thickness of the filling layer 308 between the first and second areas 310, 320 of the substrate 300 can be easily seen in FIG. 8. The CMP stop layer 303 may be removed using an etching process. In one embodiment, the etching process may comprise etching in hydrofluoric acid (HF) for about 90 seconds and then etching in phosphoric acid (H3PO4) for about 1800 seconds.

Figure 9:
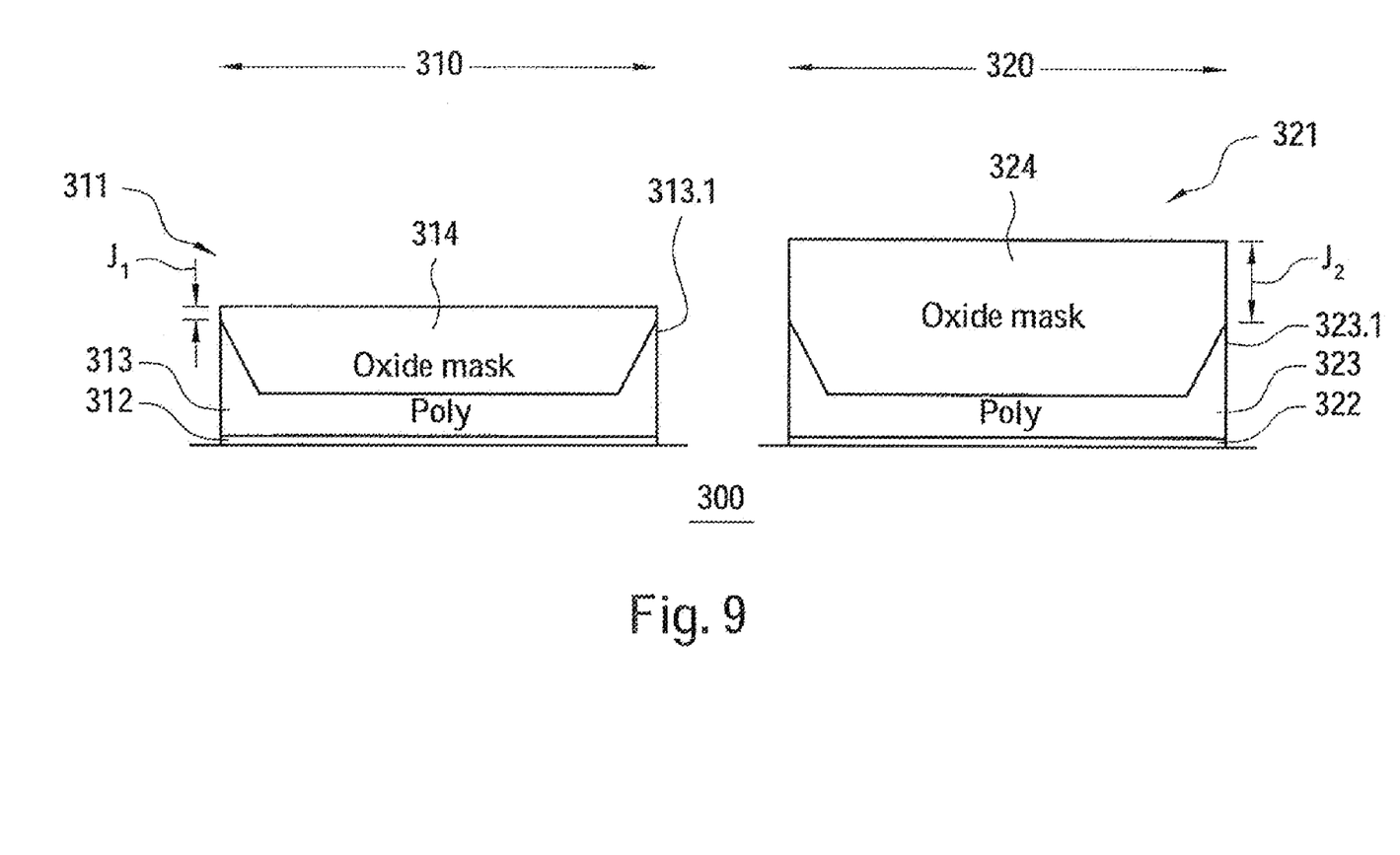

After removal of the CMP stop layer 303, the floating gate layer 302 and the insulating layer 301 are etched to define a first floating gate structure 311 comprising first tunnel "oxide" 312 and first floating gate 313 on the first area of the substrate 300 and a second floating gate structure 321 comprising second tunnel "oxide" 322 and second floating gate 323 on the second area of the substrate 300, as shown in FIG. 9. The remaining portions of filling layer 308 operate as hard etch masks during this process and form first and second "oxide" masks 314 and 324 on the first and second floating gates 313 and 323 of the first and second floating gate structures 311 and 321. Etching may be performed using sequential anisotropic etching processes. In one embodiment, the floating gate layer 302 may be etched using, for example, chlorine gas ($Cl_2$) or chlorine silane ($SiCl_4$), or hydrogen bromide (HBr). The insulating layer 301 may be etched using, for example, by wet etching in a dilute HF solution.

As illustrated in FIG. 9, the CMP process provides the first and second oxide masks 314 and 324 with square top profiles. The square top profiles of the oxide masks 314 and 324 enable the CD (critical dimension) of the masks 313 and 324 to be accurately controlled. The oxide masks 314 and 324 have significantly different thicknesses T1 and T2 as a result of the non-uniform CMP process, i.e., T2 may be approximately 100 Angstroms to approximately 300 Angstroms greater than T1, and relatively thick oxide mask material remains above tip regions 313.1 and 323.1 of the first and second floating gates 313 and 323.

Figure 10:
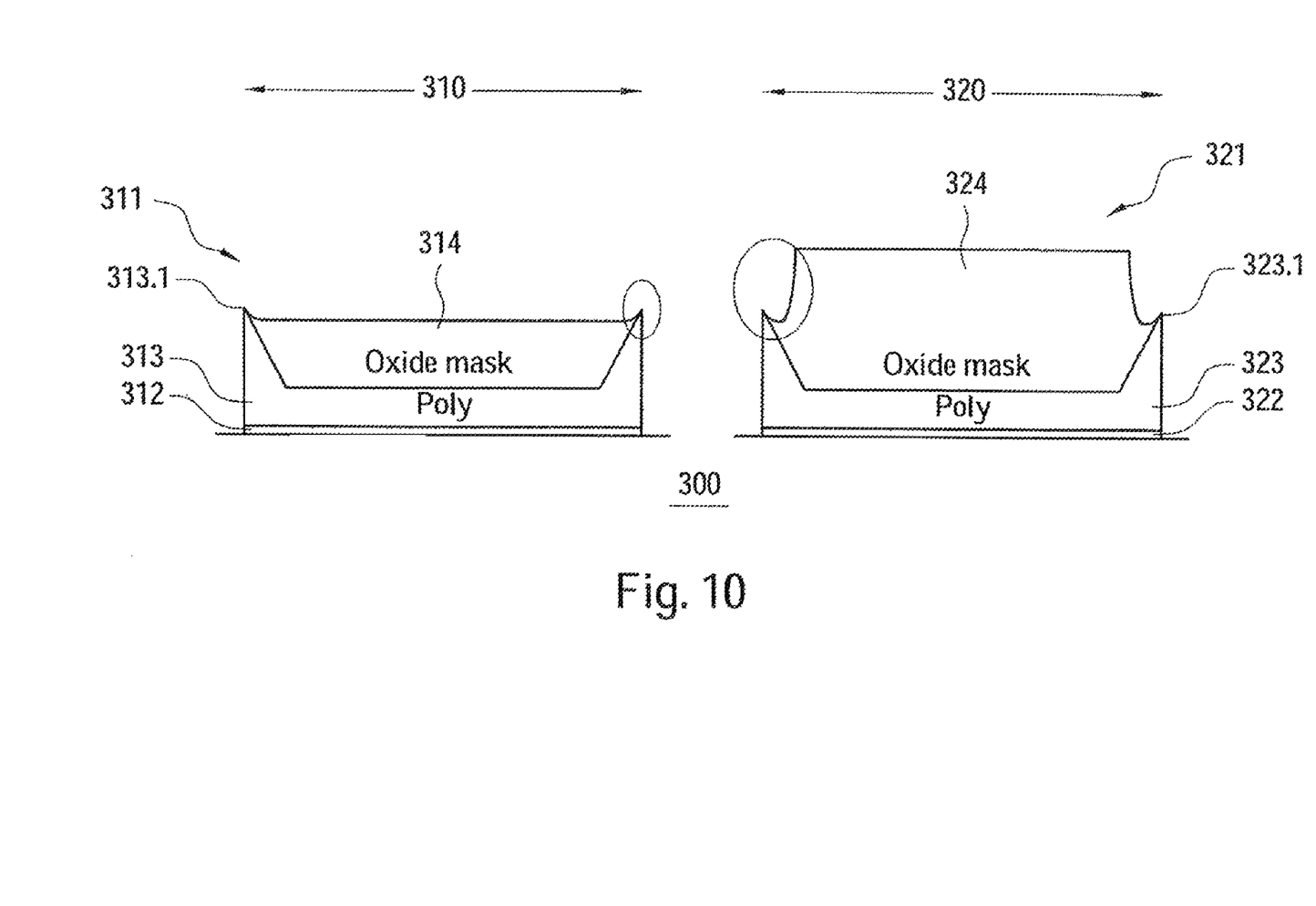

FIG. 10 shows the substrate 300 after performing an isotropic etching process on the substrate 300 to remove the relatively thick oxide mask material above tip regions 313.1 and 323.1 of the first and second floating gates 313 and 323. Accordingly the thicknesses of the encircled areas of the first and second oxide masks 314 and 324 are reduced. The encircled areas of the first and second oxide masks 314 and 324 are also relatively uniform in thickness, ranging between about 100 angstroms and about 500 angstroms, which sharpens the tip regions 313.1 and 323.1 of the first and second floating gates 313 and 323. In one embodiment, the isotropic etching process may comprise wet etching in diluted HF for approximately 50 to approximately ~150 seconds. The uniform thickness of these portions or areas of the oxide masks 314 and 324, narrows the FTV range of the memory cells, which in turn, provides a more uniform cell-to-cell erase performance. In addition, the reduced thickness of these oxide mask portions or areas, reduces the FTVs of the floating gate structures, thereby improving or speeding tip the erase performances of the memory cells.

Figure 11:
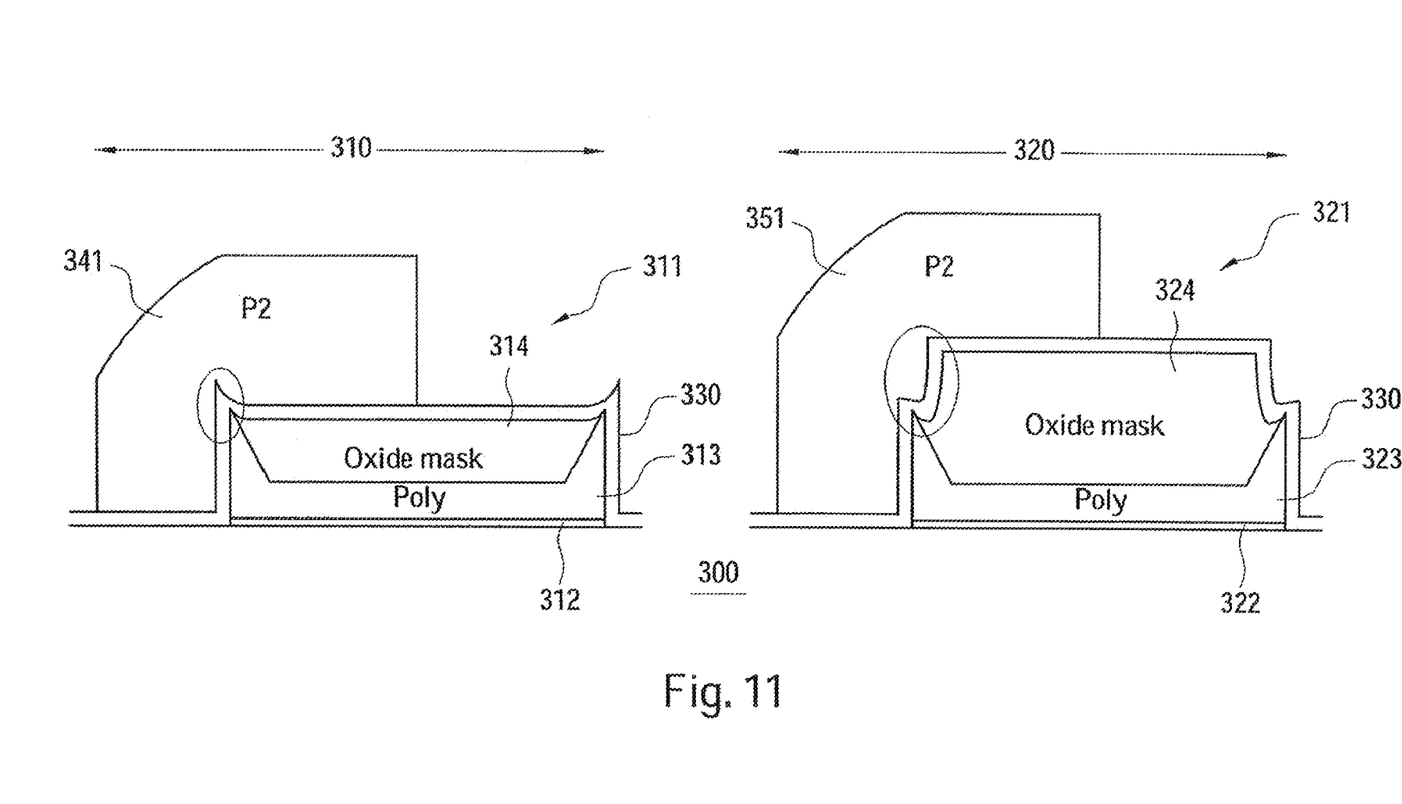

In FIG. 11, the memory cells may be completed by performing an ion implantation process to form the source/drain regions (not shown) in the substrate 300 using, for example, arsenic, phosphorus, or boron as a dopant; forming an interdielectric insulating layer 330 on the floating gate structures 311 and 321; and then forming first and second control gates 341 and 351 over the interdielectric insulating layer 330. The interdielectric insulating layer 330 may be a silicon oxide layer, silicon oxynitride layer, multiple oxide-nitride-oxide layers or any insulating layer or layers that are capable of electrically isolating the first and second control gates 341 and 351 from their respective floating gates 313 and 323. The interdielectric insulating layer 330 may be formed by an APCVD or LPCVD process using $SiH_4$ and oxygen, for example, as reaction gases. The first and second control gates 341 and 351 may be formed from an electroconductive layer such as a polysilicon, a tungsten silicide, or any other material or materials that are capable of functioning as a control gate.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method comprising the steps of:
   forming a floating gate over a substrate, the floating gate having a tip, the floating gate forming step comprising the steps of:
   forming a floating gate layer over the substrate,
   forming a stop layer over the floating gate layer,
   forming a trench in the floating gate layer;
   filling the trench with an insulative material, and
   planarizing the insulative material wherein the stop layer stops the planarizing;
   forming a mask over the floating gate, the mask having a portion adjacent to the tip of a given thickness; and
   etching the mask to reduce the given thickness of the mask portion.

2. The method according to claim 1, further comprising the step of forming a control gate over the floating gate.

3. The method according to claim 2, wherein the substrate, the floating gate and the control gate define a memory cell.

4. The method according to claim 3, wherein the memory cell comprises a flash memory cell.

5. The method according to claim 1, wherein the floating gate forming step further comprises the step of:
   removing the stop layer after the planarizing step.

6. The method according to claim 1, wherein the planarizing step is performed by a chemical-mechanical polishing process.

7. The method according to claim 1, wherein the tip is pointed.

8. The method according to claim 7, wherein the etching step sharpens the pointed tip.

9. The method according to claim 1, wherein the etching step is performed by an isotropic etching process.

10. A method comprising the steps of:
    forming at least two floating gates over a substrate, each of the floating gates having a tip;
    forming a mask over each of the floating gates, each of the masks having a portion adjacent to the tip of their respective floating gate of a given thickness, the given thicknesses of the mask portions being different from one another; and
    etching the masks to reduce the different given thicknesses of the mask portions to a reduced thickness.

11. The method according to claim 10, wherein the reduced thickness portions of the mask are of a uniform thickness.

12. The method according to claim 10, wherein the etching step sharpens the pointed tip.

13. The method according to claim 10, wherein the etching step is performed by an isotropic etching process.

* * * * *